United States Patent
Wojtczak et al.

(10) Patent No.: US 10,593,538 B2
(45) Date of Patent: Mar. 17, 2020

(54) SURFACE TREATMENT METHODS AND COMPOSITIONS THEREFOR

(71) Applicant: Fujifilm Electronic Materials U.S.A., Inc., N. Kingstown, RI (US)

(72) Inventors: William A. Wojtczak, Austin, TX (US); Keeyoung Park, Gilbert, AZ (US); Atsushi Mizutani, Woluwe Saint Lambert (BE)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

(21) Appl. No.: 15/928,152

(22) Filed: Mar. 22, 2018

(65) Prior Publication Data

US 2018/0277357 A1    Sep. 27, 2018

Related U.S. Application Data

(60) Provisional application No. 62/476,182, filed on Mar. 24, 2017, provisional application No. 62/617,688, filed on Jan. 16, 2018.

(51) Int. Cl.

| | |
|---|---|
| *H01L 21/02* | (2006.01) |
| *C09D 5/00* | (2006.01) |
| *C09D 7/20* | (2018.01) |
| *B08B 3/08* | (2006.01) |
| *C11D 11/00* | (2006.01) |
| *H01L 21/321* | (2006.01) |
| *H01L 21/3105* | (2006.01) |
| *H01L 21/306* | (2006.01) |
| *C09D 7/63* | (2018.01) |

(52) U.S. Cl.
CPC .......... *H01L 21/02052* (2013.01); *B08B 3/08* (2013.01); *C09D 5/008* (2013.01); *C09D 7/20* (2018.01); *C11D 11/0047* (2013.01); *H01L 21/02057* (2013.01); *H01L 21/02118* (2013.01); *H01L 21/02282* (2013.01); *H01L 21/02334* (2013.01); *H01L 21/306* (2013.01); *H01L 21/3105* (2013.01); *H01L 21/321* (2013.01); *C09D 7/63* (2018.01)

(58) Field of Classification Search
CPC ................................. H01L 21/02052
See application file for complete search history.

(56) References Cited

U.S. PATENT DOCUMENTS

| | | | |
|---|---|---|---|
| 8,410,296 B2 | 4/2013 | Yoshida et al. | |
| 8,623,131 B2 | 1/2014 | Yoshida et al. | |
| 8,828,144 B2 | 9/2014 | Kumon et al. | |
| 8,957,005 B2 | 2/2015 | Kumon et al. | |
| 9,053,924 B2 | 6/2015 | Kumon et al. | |
| 9,090,782 B2 | 7/2015 | Saio et al. | |
| 9,133,352 B2 | 9/2015 | Ohhashi et al. | |
| 9,228,120 B2 | 1/2016 | Kumon et al. | |
| 9,244,358 B2 | 1/2016 | Koshiyama et al. | |
| 9,281,178 B2 | 3/2016 | Kumon et al. | |
| 9,691,603 B2 | 6/2017 | Kumon et al. | |
| 9,748,092 B2 | 8/2017 | Kumon et al. | |
| 2002/0037820 A1 | 3/2002 | Small et al. | |
| 2005/0093912 A1* | 5/2005 | Vaideeswaran | B41J 2/14145 347/20 |
| 2005/0158480 A1 | 7/2005 | Goodwin et al. | |
| 2005/0215072 A1 | 9/2005 | Kevwitch et al. | |
| 2007/0218811 A1 | 9/2007 | Kurata et al. | |
| 2008/0199977 A1 | 8/2008 | Weigel et al. | |
| 2009/0311874 A1* | 12/2009 | Tomita | H01L 21/02057 438/759 |
| 2010/0056409 A1 | 3/2010 | Walker et al. | |
| 2011/0054184 A1 | 3/2011 | Yoshida et al. | |
| 2012/0017934 A1 | 1/2012 | Kumon et al. | |
| 2012/0164818 A1 | 6/2012 | Kumon et al. | |
| 2012/0211025 A1 | 8/2012 | Kumon et al. | |
| 2013/0056023 A1 | 3/2013 | Kumon et al. | |
| 2013/0255534 A1 | 10/2013 | Ryokawa et al. | |
| 2013/0280123 A1 | 10/2013 | Chen et al. | |
| 2014/0272706 A1 | 9/2014 | Kon et al. | |
| 2014/0311379 A1 | 10/2014 | Ryokawa et al. | |
| 2015/0325458 A1 | 11/2015 | Printz | |
| 2016/0148802 A1 | 5/2016 | Kumon et al. | |
| 2016/0254140 A1 | 9/2016 | Saito et al. | |
| 2016/0291477 A1 | 10/2016 | Mori et al. | |
| 2017/0062203 A1 | 3/2017 | Ryokawa et al. | |
| 2019/0211210 A1 | 7/2019 | Wojtczak et al. | |

FOREIGN PATENT DOCUMENTS

| | | | |
|---|---|---|---|
| JP | 2011-049468 | 3/2011 | |
| JP | 2012-015335 | 1/2012 | |
| JP | 2012-033881 | 2/2012 | |
| JP | 5708191 | 2/2012 | |
| JP | 2013-168583 | 8/2013 | ........... H01L 21/027 |
| JP | 6032338 | 3/2016 | |
| JP | 2017-228612 | 12/2017 | |

OTHER PUBLICATIONS

The International Search Report and Written Opinion of the International Searching Authority for International Application No. PCT/US2018/023697 by Examiner Blaine R. Copenheaver dated Jul. 6, 2018 (12 pages).
The International Search Report and Written Opinion of the International Searching Authority for International Application No. PCT/US18//66179 by Examiner Lee W. Young dated May 7, 2019.
Matsumoto et al., "A Facile Silylation of Carboxylic Acids with Hexamethyldisiloxane", Chemistry Letters, pp. 1475-1478 (1980).
U.S. Appl. No. 16/223/396, filed Dec. 18, 2018, William A. Wojtczak.
U.S. Appl. No. 16/522,187, filed Jul. 25, 2019, William A. Wojtczak.
International Search Report and Written Opinion of the International Searching Authority for International Application No. PCT/US19/43854 dated Oct. 21, 2019.
Supplementary European Search Report for European Application No. EP 18 77 2478 dated Dec. 4, 2019.

* cited by examiner (Continued)

*Primary Examiner* — Caridad Everhart
*Assistant Examiner* — Ankush K Singal
(74) *Attorney, Agent, or Firm* — Fish & Richardson P.C.

(57) ABSTRACT

The disclosure provides methods and compositions therefor for treating a surface wherein a surface treatment layer is formed on the surface, thereby minimizing or preventing pattern collapse as the surface is subjected to typical cleaning steps in the semiconductor manufacturing process.

64 Claims, No Drawings

SURFACE TREATMENT METHODS AND COMPOSITIONS THEREFOR

CROSS-REFERENCE TO RELATED APPLICATIONS

The present application claims priority to U.S. Provisional Application Ser. No. 62/617,688, filed on Jan. 16, 2018 and U.S. Provisional Application Ser. No. 62/476,182, filed on Mar. 24, 2017, both of which are hereby incorporated by reference in their entirety.

TECHNICAL FIELD

The disclosure relates generally to liquid treatment of surfaces and more particularly to liquid treatment of surfaces where formation of a hydrophobic layer is desired.

BACKGROUND

At sub-20 nm critical dimensions, pattern collapse of FinFET's and dielectric stacks during wet clean and dry has become a major problem in semiconductor manufacturing processes. The conventional theory of pattern collapse implicates high capillary forces during rinse and dry as major contributors leading to the collapse phenomenon. However, other chemical and substrate properties may play an important role as well, namely, liquid surface tension and viscosity, substrate mechanical strength, pattern density and aspect ratio, and cleaner chemistry damage to substrate surfaces.

SUMMARY

It has been found that low surface tension modifying fluids that impart the surfaces of a semiconductor substrate (e.g., a silicon or copper wafer) with a hydrophobic layer (e.g., a hydrophobic monolayer) can minimize the capillary forces that drive pattern collapse during a cleaning or drying process. Without wishing to be bound by theory, it is believed that the Laplace pressure is minimized when the contact angle, i.e., the angle a liquid (e.g., water) creates when in contact with a substrate surface, is at or near 90 degrees. This in combination with the presence of a low surface tension fluid can greatly reduce the forces that cause pattern collapse.

In general, this disclosure provides methods and compositions for treating a patterned surface of a semiconductor substrate (e.g., a patterned wafer) where a hydrophobic layer is formed on the surface, thereby minimizing or preventing pattern collapse as the surface is subjected to typical cleaning and drying steps in a semiconductor manufacturing process. The methods disclosed herein employ compositions that form a hydrophobic layer on the surface such that the treated surface has a water contact angle of at least about 50 degrees.

In some embodiments, this disclosure features surface treatment methods. Such methods can be performed, for example, by contacting a surface of a substrate (e.g., a semiconductor substrate) with a surface treatment composition including (e.g., consisting of or consisting essentially of) at least one aprotic solvent and at least one surface treatment agent, wherein the surface treatment agent includes a Si-containing compound, and the surface treatment composition forms a surface treatment layer (e.g., a hydrophobic monolayer) on the surface such that the surface has a water contact angle of at least about 50 degrees.

In some embodiments, this disclosure features methods for treating a semiconductor substrate having a pattern disposed on a surface of the substrate. The method can include contacting the surface with a surface treatment composition, in which the surface treatment composition includes (e.g., consists of or consists essentially of) at least one aprotic solvent and at least one surface treatment agent, the at least one surface treatment agent includes a Si-containing compound, and the surface treatment composition forms a surface treatment layer on the surface such that the surface has a water contact angle of at least about 50 degrees. The pattern includes a feature having a dimension of at most about 20 nm.

In some embodiments, this disclosure features methods for cleaning a wafer having a pattern disposed on a surface of the wafer. Such methods can be performed, for example, by a) contacting the surface with an aqueous cleaner; b) optionally, contacting the surface with a first rinsing solution; c) contacting the surface with a surface treatment composition, wherein the surface treatment composition includes (e.g., consists of or consists essentially of) at least one aprotic solvent and at least one surface treatment agent, the at least one surface treatment agent includes a Si-containing compound, and the surface treatment composition forms a surface treatment layer on the surface such that the surface has a water contact angle of at least about 50 degrees; d) contacting the surface with a second rinsing solution; e) drying the surface; and f) removing the surface treatment layer. In some embodiments, the pattern includes a feature having a dimension of at most about 20 nm.

In some embodiment, this disclosure features surface treatment compositions including (e.g., consisting of or consisting essentially of) at least one aprotic solvent, and at least one surface treatment agent, in which the surface treatment agent is a Si-containing compound containing a trimethylsilyl group, an aminosilyl group, or a disilazane group, and the surface treatment composition forms a surface treatment layer on a surface such that the surface has a water contact angle of at least about 50 degrees. In some embodiments, when the Si-containing compound includes a disilazane group, the disilazane group includes no Si—H bond.

In some embodiment, this disclosure features surface treatment compositions including (e.g., consisting of or consisting essentially of) (a) from about 90 wt % to about 99.5 wt % at least one aprotic solvent selected from the group consisting of lactones, ketones, aromatic hydrocarbons, siloxanes, glycol dialkyl ethers, glycol alkyl ether acetates, esters, ureas, lactams, dimethyl sulfoxide, and N-methyl pyrrolidone, and (b) from about 0.5 wt % to about 10 wt % at least one surface treatment agent, in which the surface treatment agent is a Si-containing compound containing a trimethylsilyl group, an aminosilyl group, or a disilazane group. In some embodiments, when the Si-containing compound includes a disilazane group, provided that the disilazane group includes no Si—H bond.

In some embodiment, this disclosure features surface treatment compositions consisting of propylene carbonate, hexamethyldisilazane, and optionally, at least one co-solvent.

DETAILED DESCRIPTION

In some embodiments, this disclosure relates to surface treatment methods. Such methods can be performed, for example, by contacting a surface (e.g., a surface that has patterns) of a substrate (e.g., a semiconductor substrate) with a surface treatment composition including at least one (e.g., two, three, or four) aprotic solvent and at least one (e.g., two, three, or four) surface treatment agent. The surface treatment agent can be a Si-containing compound. In general, the surface treatment composition forms a surface treatment layer (e.g., a hydrophobic monolayer) on the surface such that the surface has a water contact angle of at least about 50 degrees.

Semiconductor substrates that can be treated by the surface treatment compositions described herein typically are constructed of silicon, silicon germanium, silicon nitride, copper, Group III-V compounds such as GaAs, or any combination thereof. In some embodiments, the semiconductor substrate can be a silicon wafer, a copper wafer, a silicon dioxide wafer, a silicon nitride wafer, a silicon oxynitride wafer, a carbon doped silicon oxide wafer, a SiGe wafer, or a GaAs wafer. The semiconductor substrates may additionally contain exposed integrated circuit structures such as interconnect features (e.g., metal lines and dielectric materials). Metals and metal alloys used for interconnect features include, but are not limited to, aluminum, aluminum alloyed with copper, copper, titanium, tantalum, cobalt, nickel, silicon, polysilicon titanium nitride, tantalum nitride, tin, tungsten, SnAg, SnAg/Ni, CuNiSn, CuCoCu, and CoSn. The semiconductor substrate may also contain layers of interlayer dielectrics, silicon oxide, silicon nitride, titanium nitride, silicon carbide, silicon oxide carbide, silicon oxide nitride, titanium oxide, and carbon doped silicon oxides.

In some embodiments, the semiconductor substrate surface to be treated by the surface treatment compositions described herein includes features containing $SiO_2$, SiN, TiN, SiOC, SiON, Si, SiGe, Ge, or W. In some embodiments, the substrate semiconductor surface includes features containing $SiO_2$ and/or SiN.

In general, the semiconductor substrate surface to be treated by the surface treatment compositions described herein includes patterns formed by a prior semiconductor manufacturing process (e.g., a lithographic process including applying a photoresist layer, exposing the photoresist layer to an actinic radiation, developing the photoresist layer, etching the semiconductor substrate beneath the photoresist layer, and/or removing the photoresist layer). In some embodiments, the patterns can include features having at least one (e.g., two or three) dimension (e.g., a length, a width, and/or a depth) of at most about 20 nm (e.g., at most about 15 nm, at most about 10 nm, or at most about 5 nm) and/or at least about 1 nm (e.g., at least about 2 nm or at least about 5 nm).

In general, the surface treatment compositions described herein include at least one (two, three, or four) aprotic solvent and at least one (e.g., two, three, or four) surface treatment agent. As used herein, the phrase "aprotic solvent" refers to a solvent that lacks a hydrogen atom bounded to an oxygen (e.g., as in a hydroxyl group) or a nitrogen (e.g., as in an amine group). In some embodiments, the aprotic solvent can be a polar aprotic solvent having a relatively high dipole moment (e.g., at least 2.7). In some embodiments, the aprotic solvent is selected from the group consisting of carbonate solvents (e.g., propylene carbonate or dimethyl carbonate), lactones (e.g., gamma-butyrolactone), ketones (e.g., cyclohexanone), aromatic hydrocarbons (e.g., toluene, xylene, or mesitylene), siloxanes (e.g., hexamethyldisiloxane), glycol dialkyl ethers (e.g., dipropylene glycol dimethyl ether or propylene glycol dimethyl ether), glycol alkyl ether acetates (e.g., propylene glycol methyl ether acetate (PGMEA)), esters (e.g., ethyl lactate), ureas (e.g., 1,3-dimethyl-2-imidizolidinone or 1,3-dimethyl-3,4,5,6-tetrahydro-2(1H)-pyrimidinone), lactams, dimethyl sulfoxide, and N-methyl pyrrolidone.

In some embodiments, the aprotic solvent is selected from the group consisting of carbonate solvents (such as propylene carbonate). In some embodiments, the aprotic solvent is selected from the group consisting of lactones (such as gamma-butyrolactone).

In some embodiments, the at least one aprotic solvent is from at least about 90 wt % (e.g., at least about 91 wt %, at least about 92 wt %, at least about 93 wt %, at least about 94 wt %, at least about 95 wt %, at least about 96 wt %, at least about 97 wt %, or at least about 98 wt %) to at most about 99.9 wt % (e.g., at most about 99.5 wt %, at most about 99 wt %, at most about 98 wt %, or at most about 97 wt %) of the surface treatment compositions described herein.

In general, the surface treatment agents contemplated for use in the compositions and methods of the disclosure are Si-containing compounds. In some embodiments, the surface treatment agents can be disilazanes. For example, the surface treatment agent can be hexamethyldisilazane, heptamethyldisilazane, N-methyl hexamethyldisilazane, 1,3-diphenyltetramethyldisilazane, or 1,1,3,3-tetraphenyl-1,3-dimethyldisilazane.

In some embodiments, the surface treatment agents contemplated for use in the compositions and methods of the disclosure are selected from the group consisting of compounds including a trimethylsilyl group. For example, the surface treatment agent can be N-(trimethylsilyl)dimethylamine, N-(trimethylsilyl)diethylamine, 4-trimethylsilyloxy-3-penten-2-one, bis(trimethylsilyl)sulfate, methoxytrimethylsilane, N-allyl-N,N-bis(trimethylsilyl)amine, N-(trimethylsilyl)diethylamine, N,N-bis(trimethylsilyl) urea, or tris(trimethylsilyl)phosphite.

In some embodiments, the surface treatment agents contemplated for use in the compositions and methods of the disclosure are selected from the group consisting of aminosilanes. For example, the am inosilane can be bis(dimethylamino)dimethylsilane or phenethyldimethyl(dimethylamino)silane.

In some embodiments, the at least one surface treatment agent is from at least about 0.5 wt % (e.g., at least about 1 wt %, at least about 2 wt %, at least about 3 wt %, at least about 4 wt %, at least about 5 wt %, at least about 6 wt %, at least about 7 wt %, or at least about 8 wt %) to at most about 10 wt % (e.g., at most about 9.5 wt %, at most about 9 wt %, at most about 8 wt %, or at most about 7 wt %) of the surface treatment compositions described herein.

Without wishing to be bound by theory, it is believed that the surface treatment compositions described herein can form a surface treatment layer (e.g., a hydrophobic layer such as a hydrophobic monolayer) on a patterned surface of a semiconductor substrate such that the patterned surface has a water contact angle of at least about 50 degrees (e.g., at least about 55 degrees, at least about 60 degrees, at least about 65 degrees, at least about 70 degrees, at least about 75 degrees, at least about 80 degrees, at least about 85 degrees, at least about 89 degrees, at least about 90 degrees, at least about 95 degrees, or at least about 100 degrees). Without wishing to be bound by theory, it is believed that such a surface treatment layer can prevent or minimize the collapse of the patterned features on the semiconductor substrate during a cleaning or drying step typically used in the semiconductor manufacturing process. In some embodiments, upon treatment with the surface treatment compositions described herein, at least about 70% (e.g., at least about 75%, at least about 80%, at least about 85%, at least about 90%, at least about 95%, at least about 98%, or at least about 99%) of the features (e.g., pillars) on a patterned wafer can remain uncollapsed after a cleaning or drying step.

In some embodiments, the surface treatment compositions described herein can further include at least one catalyst. Exemplary catalysts include, but are not limited to, triazoles (e.g., benzotriazole), anhydrides (e.g., phthalic anhydride or acetic anhydride), organic acids (e.g., sulfonic acids such as methanesulfonic acid or trifluoromethane-sulfonic acid), inorganic acids (e.g., sulfuric acid).

In some embodiments, the at least one catalyst is from at least about 0.1 wt % (e.g., at least about 0.2 wt %, at least about 0.3 wt %, at least about 0.4 wt %, at least about 0.5 wt %, at least about 0.6 wt %, at least about 0.7 wt %, or at least about 0.8 wt %) to at most about 1 wt % (e.g., at most about 0.95 wt %, at most about 0.9 wt %, at most about 0.8 wt %, at most about 0.7 wt %, at most about 0.6 wt %, or at most about 0.5 wt %) of the surface treatment compositions described herein. Without wishing to be bound by theory, it is believed that the catalyst can facilitate the formation of the surface treatment layer by the surface treatment agent on a patterned surface of a semiconductor substrate (e.g., through facilitating a reaction between the surface treatment agent and the patterned surface).

In some embodiments, the surface treatment compositions described herein can further include water. In some embodiments, the water is at most about 2 wt % (e.g., at most about 1.5 wt %, at most about 1 wt %, at most about 0.8 wt %, at most about 0.6 wt %, at most about 0.5 wt %, at most about 0.4 wt %, at most about 0.2 wt %, or at most about 0.1 wt %) of the surface treatment compositions described herein. In some embodiments, the surface treatment compositions described herein are substantially free of water (except for the trace amount of water in the solvent). In such embodiments, the surface treatment compositions described herein can include at most about 1000 ppm (e.g., at most about 100 ppm, at most about 10 ppm, or at most about 1 ppm) water.

In some embodiments, the surface treatment compositions described herein can specifically exclude one or more of the additive components, in any combination, if more than one. Such components are selected from the group consisting of non-aromatic hydrocarbons, cyclic silazanes (e.g., heterocyclic silazanes), protic solvents (e.g., alcohols or amides), lactones (e.g., those with 5- or 6-membered rings), certain Si-containing compounds (e.g., those having a Si—H group or an aminosilyl group), polymers, oxygen scavengers, quaternary ammonium salts including quaternary ammonium hydroxides, amines, bases (such as alkaline bases (e.g., NaOH, KOH, LiOH, $Mg(OH)_2$, and $Ca(OH)_2$)), surfactants, defoamers, fluoride-containing compounds (e.g., HF, $H_2SiF_6$, $H_2PF_6$, $HBF_4$, $NH_4F$, and tetraalkylammonium fluoride), oxidizing agents (e.g., peroxides, hydrogen peroxide, ferric nitrate, potassium iodate, potassium permanganate, nitric acid, ammonium chlorite, ammonium chlorate, ammonium iodate, ammonium perborate, ammonium perchlorate, ammonium periodate, ammonium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, and peracetic acid), abrasives, silicates, hydroxycarboxylic acids, carboxylic and polycarboxylic acids lacking amino groups, silanes (e.g., alkoxysilanes), cyclic compounds (e.g., cyclic compounds containing at least two rings, such as substituted or unsubstituted naphthalenes, or substituted or unsubstituted biphenylethers) other than the cyclosiloxanes described herein, chelating agents (e.g., azoles, diazoles, triazoles, or tetrazoles), corrosion inhibitors (such as azole or non-azole corrosion inhibitors), buffering agents, guanidine, guanidine salts, pyrrolidone, polyvinyl pyrrolidone, metal halides, and metal-containing catalysts.

In some embodiments, the surface treatment methods described herein can further include contacting the surface of a substrate with at least one aqueous cleaning solution before contacting the surface with a surface treatment composition. In such embodiments, the at least one aqueous cleaning solution can include water, an alcohol, aqueous ammonium hydroxide, aqueous hydrochloric acid, aqueous hydrogen peroxide, an organic solvent, or a combination thereof.

In some embodiments, the surface treatment methods described herein can further include contacting the surface of a substrate with a first rinsing solution (e.g., water, an organic solvent such as isopropanol, or a combination thereof) after contacting the surface with the at least one aqueous cleaning solution but before contacting the surface with the surface treatment composition. In some embodiments, the surface treatment methods described herein can further include contacting the surface with a second rinsing solution (e.g., water, an organic solvent such as isopropanol, or a combination thereof) after contacting the surface with the surface treatment composition. In some embodiments, the surface treatment methods described herein can further include drying the surface (e.g., after contacting the surface with first rinsing solution, the surface treatment composition, or the second rinsing solution). In some embodiments, the surface treatment methods described herein can further include removing the surface treatment layer from the surface.

In some embodiments, this disclosure provides methods for cleaning a semiconductor substrate (e.g., a wafer) having a pattern disposed on a surface of the substrate. Such methods can be performed, for example, by:

a) optionally, contacting the surface with an aqueous cleaner;

b) optionally, contacting the surface with a first rinsing solution;

c) contacting the surface with a surface treatment composition, wherein the surface treatment composition includes at least one aprotic solvent and at least one surface treatment agent, in which the at least one surface treatment agent includes a Si-containing compound, and the surface treatment composition forms a surface treatment layer on the surface such that the surface has a water contact angle of at least about 50 degrees;

d) optionally, contacting the surface with a second rinsing solution;

e) drying the surface; and f) optionally, removing the surface treatment layer to form a cleaned, patterned surface.

In such embodiments, the pattern can include a feature having a dimension of at most about 20 nm.

In step a) of the above described method, the substrate (e.g., a wafer) bearing a patterned surface is treated with one or more aqueous cleaning solutions. When the patterned surface is treated with two or more aqueous cleaning solutions, the cleaning solutions can be applied sequentially. The aqueous cleaning solutions can be water alone or can be solutions containing water, a solute, and optionally an organic solvent. In some embodiments, the aqueous cleaning solutions can include water, an alcohol (e.g., a water soluble alcohol such as isopropanol), an aqueous ammonium hydroxide solution, an aqueous hydrochloric acid solution, an aqueous hydrogen peroxide solution, an organic solvent (e.g., a water soluble organic solvent), or a combination thereof.

In step b), the cleaning solution from step a) can be optionally rinsed away using a first rinsing solution. The first rinsing solution can include water, an organic solvent (e.g., isopropanol), or an aqueous solution containing an organic solvent. In some embodiments, the first rinsing solution is at least partially miscible with the cleaning solution used in step a). In some embodiments, step b) can be omitted when the cleaning solution used in step a) is not moisture sensitive or does not contain any appreciable amount of water.

In step c), the substrate surface can be treated with a surface treatment composition of the disclosure described above to form a modified surface having a surface treatment layer (e.g., a hydrophobic layer). The modified surface thus formed can be hydrophobic and can have a water contact angle of at least about 50 degrees. In some embodiments, this step can be performed at a temperature of about 20-35° C. for a process time ranging from about 10 seconds to about 300 seconds.

In step d), after the substrate surface is treated with a surface treatment composition, the surface can optionally be rinsed with a second rinsing solution. The second rinsing solution can include water, an organic solvent (e.g., isopropanol), or an aqueous solution containing an organic solvent. In some embodiments, this step can be performed at a temperature of about 20-70° C.

In step e), the substrate surface can be dried (e.g., by using a pressurized gas). Without wishing to be bound by theory, it is believed that, after the substrate surface is treated with a surface treatment composition described herein, the collapse of patterns on the surface during this drying step is minimized.

In step f), after the drying step, the surface treatment layer (e.g., a hydrophobic layer) can optionally be removed. In general, the surface treatment layer can be removed by a number of methods depending on the chemical characteristics of the modified surface. Suitable methods for removing the surface treatment layer include plasma sputtering; plasma ashing; thermal treatment at atmospheric or sub atmospheric pressure; treatment with an acid, base, oxidizing agent or solvent containing condensed fluid (e.g., supercritical fluids such as supercritical $CO_2$); vapor or liquid treatment; UV irradiation; or combinations thereof.

The semiconductor substrate having a cleaned, patterned surface prepared by the method described above can be further processed to form one or more circuits on the substrate or can be processed to form into a semiconductor device (e.g., an integrated circuit device such as a semiconductor chip) by, for example, assembling (e.g., dicing and bonding) and packaging (e.g., chip sealing).

In some embodiments, this disclosure features articles (e.g., an intermediate semiconductor article found during the manufacturing of a semiconductor device) that includes a semiconductor substrate, and a surface treatment composition described herein supported by the semiconductor substrate. The surface treatment composition can include at least one aprotic solvent and at least one Si-containing compound, such as those described above.

The present disclosure is illustrated in more detail with reference to the following examples, which are for illustrative purposes and should not be construed as limiting the scope of the present disclosure.

EXAMPLE 1

Surface treatment solutions (i.e., formulations 1-101) were prepared by mixing the components at room temperature. The compositions of formulations 1-101 are summarized in Table 1 below. All percentages listed in Table 1 are weight percentages, unless indicated otherwise.

The Coupons containing $SiO_2$ or SiN thin films on Si substrates were cut into 1×1 inch squares. The coupons were immersed vertically into 100 mL of stirred (50 RPM) Surface Treatment Solutions and were kept at the corresponding temperatures indicated in Table 1. The coupons were processed for the corresponding times indicated in Table 1. The coupons were then rinsed with isopropanol at 50° C. and dried by using pressurized nitrogen gas.

The coupons were placed on the AST VCA 3000 Contact Angle Tool and the following procedure was followed to measure the contact angles:

1. Place the $SiO_2$ or SiN coupon onto the stage.
2. Raise the stage upward by rotating Vertical Knob clockwise until the specimen is just below the needle.
3. Dispense a drop of De-ionized water, lightly touching the specimen surface, then lower the specimen until the droplet separates from the needle tip.
4. Center the drop across the field-of-view using transverse knob for stage adjustment.
5. Focus the drop in field-of-view to get a sharp image by moving the stage along guide rails.
6. Click the "AutoFAST" button to freeze the image and calculate. Two numbers will be displayed; these are the left and right contact angles.
7. To calculate manually, use the mouse to place five markers around the droplet.
8. Select the droplet icon from the Main Menu to calculate the contact angle.
9. This will create a curve fit and tangent lines on the image. Two numbers will be displayed in the left-hand-corner of the screen; these are the left and right contact angles.
10. Repeat above procedure at 3 substrate sites and average the resulting contact angles and report the average result in Table 1.

TABLE 1

| Form. # | Solvent[1] | Co-solvent | Silane | Catalyst | T (° C.) | Process time (s) | $SiO_2$ $CA^2$ | SiN $CA^2$ |
| --- | --- | --- | --- | --- | --- | --- | --- | --- |
| 0 | | | No Treatment | | | | <15 | <15 |
| 1 | Propylene Carbonate | — | 3% HMDS[3] | — | 25 | 180 | 90 | 87 |
| 2 | Propylene Carbonate | 0.2% $H_2O$ | 3% HMDS | — | 25 | 180 | 88 | 89 |
| 3 | Propylene Carbonate | 0.4% $H_2O$ | 3% HMDS | — | 25 | 180 | 88 | 88 |
| 4 | Propylene Carbonate | 0.6% $H_2O$ | 3% HMDS | — | 25 | 180 | 89 | 89 |
| 5 | Propylene Carbonate | 1% $H_2O$ | 3% HMDS | — | 25 | 180 | 85 | 88 |

TABLE 1-continued

| Form. # | Solvent[1] | Co-solvent | Silane | Catalyst | T (° C.) | Process time (s) | SiO$_2$ CA[2] | SiN CA[2] |
|---|---|---|---|---|---|---|---|---|
| 6 | Propylene Carbonate | 1.5% H$_2$O | 3% HMDS | — | 25 | 180 | 84 | 83 |
| 7 | Propylene Carbonate | 2% H$_2$O | 3% HMDS | — | 25 | 180 | 63 | 48 |
| 8 | Propylene Carbonate | — | 0.1% HMDS | — | 25 | 180 | 39 | 36 |
| 9 | Propylene Carbonate | — | 0.5% HMDS | — | 25 | 180 | 54 | 59 |
| 10 | Propylene Carbonate | — | 1% HMDS | — | 25 | 180 | 68 | 66 |
| 11 | Propylene Carbonate | — | 2% HMDS | — | 25 | 180 | 81 | 79 |
| 12 | Propylene Carbonate | — | 5% HMDS | — | 25 | 180 | 92 | 90 |
| 13 | Propylene Carbonate | — | 10% HMDS | — | 25 | 180 | 90 | 90 |
| 14 | Propylene Carbonate | — | 3% HMDS | — | 25 | 10 | 88 | 89 |
| 15 | Propylene Carbonate | — | 3% HMDS | — | 25 | 30 | 91 | 88 |
| 16 | Propylene Carbonate | — | 3% HMDS | — | 25 | 60 | 90 | 88 |
| 17 | Propylene Carbonate | — | 3% HMDS | — | 25 | 300 | 92 | 90 |
| 18 | Propylene Carbonate | — | 3% 4-Trimethylsilyloxy-3-penten-2-one | — | 25 | 180 | 83 | 65 |
| 19 | Propylene Carbonate | — | 5% 4-Trimethylsilyloxy-3-penten-2-one | — | 25 | 180 | 80 | 57 |
| 20 | Propylene Carbonate | — | 3% Bis(dimethylamino)-dimethylsilane | — | 25 | 180 | 93 | 94 |
| 21 | Propylene Carbonate | — | 3% Bis-(trimethylsilyl) sulfate | — | 25 | 180 | 88 | 74 |
| 22 | Dimethyl Carbonate | — | 3% HMDS | — | 25 | 180 | 69 | 69 |
| 23 | Diethyl Carbonate | — | 3% HMDS | — | 25 | 180 | 67 | 66 |
| 24 | γ-Butyrolactone | — | 3% HMDS | — | 25 | 180 | 82 | 84 |
| 25 | γ-Butyrolactone | — | 3% Bis(dimethylamino)-dimethylsilane | — | 25 | 180 | 95 | 90 |
| 26 | γ-Butyrolactone | — | 3% Bis-(trimethylsilyl) sulfate | — | 25 | 180 | 65 | — |
| 27 | γ-Butyrolactone | — | 3% Bis-(trimethylsilyl) sulfate | 0.5% BTA | 25 | 180 | 61 | 57 |
| 28 | γ-Butyrolactone | — | 3% Bis-(trimethylsilyl) sulfate | 0.5% Phthalic Anhydride | 25 | 180 | 67 | 66 |
| 29 | γ-Butyrolactone | — | 3% Bis-(trimethylsilyl) sulfate | 0.5% BTA | 50 | 180 | 86 | 76 |
| 30 | γ-Butyrolactone | — | 3% HMDS | — | 25 | 300 | 86 | 82 |
| 31 | γ-Butyrolactone | — | 3% HMDS | 0.5% Phthalic anhydride | 25 | 300 | 90 | 90 |
| 32 | γ-Butyrolactone | — | 3% Methoxytrimethyl-silane | — | 25 | 300 | <10 | <10 |
| 33 | γ-Butyrolactone | — | 3% Methoxytrimethyl-silane | 0.5% Phthalic anhydride | 25 | 300 | 80 | 11 |
| 34 | γ-Butyrolactone | — | 3% N-Allyl-N,N-bis(trimethylsilyl) amine | — | 25 | 300 | 77 | — |
| 35 | γ-Butyrolactone | — | 3% 1,1,3,3-Tetraphenyl-1,3-dimethyl-disilazane | — | 25 | 300 | 58 | — |
| 36 | γ-Butyrolactone | — | 3% N-(Trimethylsilyl)-diethylamine | — | 25 | 300 | 85 | — |
| 37 | γ-Butyrolactone | — | 3% N-methyl hexa-methyldisilazane | — | 25 | 300 | 91 | — |

TABLE 1-continued

| Form. # | Solvent[1] | Co-solvent | Silane | Catalyst | T (° C.) | Process time (s) | SiO$_2$ CA[2] | SiN CA[2] |
|---|---|---|---|---|---|---|---|---|
| 38 | γ-Butyrolactone | — | 3% 1,3-Diphenyltetra-methyldisilazane | — | 25 | 300 | 63 | — |
| 39 | γ-Butyrolactone | — | 3% Bis(trimethylsilyl) sulfate | — | 25 | 300 | 65 | — |
| 40 | DMSO | — | 3% Phenethyldimethyl-(dimethylamino) silane | 0.5% Phthalic Anhydride | 25 | 180 | 42 | 48 |
| 41 | DMSO | — | 3% N,N,-Bis (trimethylsilyl) urea | 0.5% Phthalic Anhydride | 25 | 180 | 33 | 43 |
| 42 | DMSO | — | 3% N,N,-Bis (trimethylsilyl) urea | — | 25 | 180 | 17 | 21 |
| 43 | DMSO | — | 3% Bis (dimethylamino)-dimethylsilane | — | 25 | 180 | 85 | 86 |
| 44 | DMSO | — | 3% Bis-(trimethylsilyl) sulfate | 0.5% BTA | 25 | 180 | 83 | 74 |
| 45 | DMSO | — | 3% Bis-(trimethylsilyl) sulfate | 0.5% Phthalic Anhydride | 25 | 180 | 83 | 74 |
| 46 | DMSO | — | 3% Bis-(trimethylsilyl) sulfate | 0.5% BTA | 50 | 180 | 85 | 75 |
| 47 | DMSO | — | 3% Bis-(trimethylsilyl) sulfate | 0.5% of 96% H$_2$SO$_4$ | 25 | 180 | 67 | 59 |
| 48 | DMSO | — | 3% Bis-(trimethylsilyl) sulfate | 0.5% of MSA | 25 | 180 | 76 | 64 |
| 49 | DMSO | — | 3% HMDS | — | 25 | 300 | 69 | 64 |
| 50 | DMSO | — | 3% HMDS | 0.5% Acetic Anhydride | 25 | 300 | 89 | 87 |
| 51 | DMSO | — | 3% HMDS | 0.5% Phthalic anhydride | 25 | 300 | 87 | 86 |
| 52 | DMSO | — | 3% N-methyl hexa-methyldisilazane | 0.5% Phthalic | 25 | 300 | 92 | 92 |
| 53 | DMSO | — | 1.5% Bis-(trimethylsilyl) sulfate | 0.5% BTA | 25 | 60 | 80 | 80 |
| 54 | DMSO | — | 3% Bis-(trimethylsilyl) sulfate | 0.5% BTA | 25 | 60 | 88 | 85 |
| 55 | DMSO | — | 4.5% Bis-(trimethylsilyl) sulfate | 0.5% BTA | 25 | 60 | 90 | 91 |
| 56 | NMP | — | 3% HMDS | — | 25 | 300 | 66 | 61 |
| 57 | NMP | — | 3% HMDS | 0.5% Acetic Anhydride | 25 | 300 | 87 | 89 |
| 58 | NMP | — | 3% HMDS | — | 25 | 300 | 66 | 61 |
| 59 | NMP | — | 3% HMDS | 0.5% Phthalic anhydride | 25 | 300 | 88 | 88 |
| 60 | NMP | — | 3% N-methyl hexa-methyldisilazane | 0.5% BTA | 25 | 300 | 89 | 91 |
| 61 | NMP | — | 3% N-methyl hexa-methyldisilazane | 0.5% Phthalic | 25 | 300 | 93 | 89 |
| 62 | Dipropylene glycol dimethyl ether | — | 3% Tris-(trimethylsilyl)-phosphite | 0.5% Phthalic Anhydride | 25 | 180 | 58 | 50 |
| 63 | Dipropylene glycol dimethyl ether | — | 3% Tris (trimethyl-silyl) phosphite | — | 25 | 180 | 24 | 20 |
| 64 | Dipropylene glycol dimethyl ether | — | 3% Bis (dimethylamino)-dimethylsilane | — | 25 | 180 | 79 | 81 |
| 65 | Dipropylene glycol dimethyl ether | — | 3% N-methyl hexa-methyldisilazane | 0.5% BTA | 25 | 300 | 81 | 59 |

TABLE 1-continued

| Form. # | Solvent[1] | Co-solvent | Silane | Catalyst | T (° C.) | Process time (s) | SiO$_2$ CA[2] | SiN CA[2] |
|---|---|---|---|---|---|---|---|---|
| 66 | PGMEA[4] | — | 3% HMDS | — | 25 | 180 | 78 | 87 |
| 67 | PGMEA | — | 10% HMDS | — | 25 | 180 | 88 | 91 |
| 68 | PGMEA | — | 6% HMDS | — | 25 | 180 | 81 | 79 |
| 69 | PGMEA | — | 6% HMDS | 0.5% BTA | 25 | 180 | 85 | 85 |
| 70 | PGMEA | — | 3% Bis(dimethylamino)-dimethylsilane | 0.5% BTA | 25 | 60 | 89 | 86 |
| 71 | PGME[5] | — | 3% HMDS | — | 25 | 300 | 27 | 30 |
| 72 | PGME | — | 3% HMDS | 0.5% Phthalic anhydride | 25 | 300 | 75 | 24 |
| 73 | Isopropanol | — | 3% HMDS | — | 25 | 300 | 48 | 41 |
| 74 | Isopropanol | — | 3% HMDS | 0.5% Phthalic anhydride | 25 | 300 | 80 | 44 |
| 75 | Glacial Acetic Acid | — | 3% Bis(dimethylamino)-dimethylsilane | — | 25 | 180 | 72 | 72 |
| 76 | Toluene | — | 3% HMDS | — | 25 | 300 | 65 | 64 |
| 77 | Toluene | — | 3% HMDS | 0.5% Phthalic anhydride | 25 | 300 | 83 | 69 |
| 78 | Cyclohexanone | — | 6% HMDS | — | 25 | 180 | 84 | 84 |
| 79 | Cyclohexanone | — | 6% HMDS | 0.5% BTA | 25 | 180 | 80 | 84 |
| 80 | Cyclohexanone | — | 3% Bis(dimethylamino)-dimethylsilane | 0.5% BTA | 25 | 60 | 81 | 54 |
| 81 | Ethyl Lactate | — | 6% HMDS | — | 25 | 180 | 81 | 77 |
| 82 | Ethyl Lactate | — | 6% HMDS | 0.5% BTA | 25 | 180 | 75 | 72 |
| 83 | Ethyl lactate | — | 3% Bis(dimethylamino)-dimethylsilane | 0.5% BTA | 25 | 60 | 61 | 65 |
| 84 | 1,3-dimethyl-2-imidizolidinone | — | 3% HMDS | — | 25 | 180 | 57 | 72 |
| 85 | 1,3-Dimethyl-3,4,5,6-tetrahydro-2(1H)-pyrimidinone | — | 3% HMDS | — | 25 | 180 | 50 | 50 |
| 86 | Propylene carbonate | 6% HMDSO[6] | 3% HMDS | — | 25 | 30 | 80.6 | — |
| 87 | Xylene | 6% HMDSO | 3% HMDS | — | 25 | 30 | 65.9 | -- |
| 88 | PGMEA | 6% HMDSO | 3% HMDS | — | 25 | 30 | 57.2 | — |
| 89 | Dimethyl carbonate | 6% HMDSO | 3% HMDS | — | 25 | 30 | 57.0 | — |
| 90 | Cyclohexanone | 6% HMDSO | 3% HMDS | — | 25 | 30 | 71.0 | — |
| 91 | Propylene carbonate | 6% HMDSO | 3.3% HMDSA[7] | — | 25 | 30 | 78.8 | — |
| 92 | Propylene carbonate | 6% HMDSO | 4.3% TMSDMA[8] | — | 25 | 30 | 96.1 | — |
| 93 | Propylene carbonate | 6% HMDSO | 5.4% BDADMS[9] | — | 25 | 30 | 91.6 | — |
| 94 | Xylene | 6% HMDSO | 0.6% TMSDMA | — | 25 | 30 | 89.1 | — |
| 95 | Xylene | 6% HMDSO | 2.2% TMSDMA | — | 25 | 30 | 88.2 | — |
| 96 | Propylene carbonate | 10% Xylene | 8% HMDS | — | 25 | 30 | 95.4 | — |
| 97 | Propylene carbonate | 10% Mesitylene | 8% HMDS | — | 25 | 30 | 95.9 | — |
| 98 | Xylene | 6% Propylene carbonate | 2% TMSDMA | — | 25 | 30 | 91.3 | — |
| 99 | Mesithylene | 6% PGMEA | 2% TMSDMA | — | 25 | 30 | 90.9 | — |
| 100 | HMDSO | 10% Propylene carbonate | 2% TMSDMA | — | 25 | 30 | 93.8 | — |
| 101 | HMDSO | 10% PGMEA | 2% TMSDMA | — | 25 | 30 | 92.5 | — |

[1]Solvent makes up the remainder of the formulation
[2]"CA" refers to contact angle (degrees)
[3]"HMDS" refers to hexamethyldisilazane
[4]"PGMEA" refers to propylene glycol methyl ether acetate
[5]"PGME" refers to propylene glycol methyl ether
[6]"HMDSO" refers to hexamethyldisiloxane
[7]"HMDSA" refers to heptamethyldisilazane
[8]"TMSDMA" refers to N-(trimethylsilyl)dimethylamine
[9]"BDADMS" refers to bis(dimethylamino)dimethylsilane As shown in Table 1, a majority of formulas 1-101 containing an aprotic solvent and a Si-containing compound exhibited a contact angle close to 90° on a SiO₂ or SiN surface.

EXAMPLE 2

Surface treatment solutions (i.e., formulations 102-115) were prepared by mixing the components at room temperature. The compositions of formulations 102-115 are summarized in Table 2 below. All percentages listed in Table 2 are weight percentages, unless indicated otherwise.

Patterned wafers were treated with formulations 102-115. High aspect ratio Si pillar patterned wafers were diced into 0.5 inch by 0.5 inch coupons. The coupons were then immersed into stirred 25° C. surface treatment solutions for 30-180 seconds. The coupons were removed from the surface treatment solutions and rinsed in a beaker containing stirred 50° C. isopropyl alcohol for 60 seconds. The coupons were then removed from the Isopropyl alcohol rinse and dried with a N₂ gas dispense gun oriented perpendicularly to the coupon at a working distance of 1 inch with gas pressure of 45 psi. The coupons were then analyzed by scanning electron microscopy over three randomly selected sites at a magnification of 50000× and the number of uncollapsed silicon pillars were tabulated. The average of uncollapsed Si-pillars at the three sites are reported in Table 2 as a percentage of the total Si pillars observed.

TABLE 2

| Form. # | Solvent[1] | Co-solvent | Silane | T (° C.) | Process time (s) | Uncollapsed Si Pillars |
|---|---|---|---|---|---|---|
| 102 | PGMEA | 3% HMDSO | 2.2% TMSDMA | 25 | 30 | 94.6% |
| 103 | PGMEA | 5% HMDSO | 2.2% TMSDMA | 25 | 30 | 99.6% |
| 104 | PGMEA | 10% HMDSO | 2.2% TMSDMA | 25 | 30 | 99.5% |
| 105 | Dimethyl Carbonate | 3% HMDSO | 2.2% TMSDMA | 25 | 30 | 96.8% |
| 106 | Dimethyl Carbonate | 5% HMDSO | 2.2% TMSDMA | 25 | 30 | 98.8% |
| 107 | Dimethyl Carbonate | 10% HMDSO | 2.2% TMSDMA | 25 | 30 | 98.4% |
| 108 | PGMEA | 1.5% HMDSO | 2.2% TMSDMA | 25 | 30 | 97.8% |
| 109 | PGMEA | 0.8% HMDSO | 2.2% TMSDMA | 25 | 30 | 76.8% |
| 110 | Xylene | 1.5% HMDSO | 2.2% TMSDMA | 25 | 30 | 98.2% |
| 111 | Methyl ethyl ketone | 1.5% HMDSO | 2.2% TMSDMA | 25 | 30 | 98.6% |
| 112 | N-butyl lactate | 1.5% HMDSO | 2.2% TMSDMA | 25 | 30 | 97.5% |
| 113 | Acetone | 47.8% HMDSO | 2.2% TMSDMA | 25 | 180 | 91.7% |
| 114 | Propylene Carbonate | 10% Xylene | 8% HMDS | 25 | 30 | 99.5% |
| 115 | Propylene Carbonate | 10% Mesithylene | 8% HMDS | 25 | 30 | 97.5% |

[1]Solvent makes up the remainder of the formulation

As shown in Table 2, upon treatment with formulations 102-115, a substantial portion of silicon pillars on patterned silicon wafers remained after a cleaning or drying process.

While the disclosure has been described in detail with reference to certain embodiments thereof, it is understood that modifications and variations are within the spirit and scope of that which is described and claimed.

What is claimed is:

1. A method for treating a semiconductor substrate having a pattern disposed on a surface of the substrate, comprising:
   contacting the surface with a surface treatment composition, wherein the surface treatment composition comprises at least one aprotic solvent and at least one surface treatment agent, the at least one surface treatment agent comprises a Si-containing compound, and the surface treatment composition forms a surface treatment layer on the surface such that the surface has a water contact angle of at least about 50 degrees;
   wherein the pattern comprises a feature having a dimension of at most about 20 nm.

2. The method of claim 1, wherein the surface comprises SiO₂, SiN, TiN, SiOC, SiON, Si, SiGe, Ge, or W.

3. The method of claim 1, wherein the at least one aprotic solvent is selected from the group consisting of carbonate solvents, lactones, ketones, aromatic hydrocarbons, siloxanes, glycol dialkyl ethers, glycol alkyl ether acetates, esters, ureas, lactams, dimethyl sulfoxide, and N-methyl pyrrolidone.

4. The method of claim 1, wherein the at least one aprotic solvent comprises a carbonate solvent.

5. The method of claim 4, wherein the carbonate solvent is propylene carbonate.

6. The method of claim 1, wherein the at least one aprotic solvent comprises a lactone.

7. The method of claim 6, wherein the lactone is gamma-butyrolactone.

8. The method of claim 1, wherein the at least one aprotic solvent is from about 90 wt % to about 99.9 wt % of the surface treatment composition.

9. The method of claim 1, wherein the Si-containing compound is a disilazane.

10. The method of claim 9, wherein the disilazane is hexamethyldisilazane, heptamethyldisilazane, N-methyl hexamethyldisilazane, 1,3-diphenyltetramethyldisilazane, or 1,1,3,3-tetraphenyl-1,3-dimethyldisilazane.

11. The method of claim 1, wherein the Si-containing compound comprises a trimethylsilyl group.

12. The method of claim 11, wherein the Si-containing compound is N-(trimethylsilyl)dimethylamine, N-(trimethylsilyl)diethylamine, 4-trimethylsilyloxy-3-penten-2-one, bis-trimethylsilyl sulfate, methoxytrimethylsilane, N-allyl-N,N-bis(trimethylsilyl)amine, N-(trimethylsilyl)diethylamine, N, N-bis-trimethylsilyl urea, or tris-trimethylsilylphosphite.

13. The method of claim 1, wherein the Si-containing compound is an aminosilane.

14. The method of claim 13, wherein the aminosilane is bis(dimethylamino)dimethylsilane or phenethyldimethyl(dimethylamino)silane.

15. The method of claim 1, wherein the at least one surface treatment agent is from about 0.5 wt % to about 10 wt % of the surface treatment composition.

16. The method of claim 1, wherein the surface treatment composition further comprises a catalyst.

17. The method of claim 16, wherein the catalyst is benzotriazole, phthalic anhydride, acetic anhydride, methanesulfonic acid, sulfuric acid, or trifluoromethanesulfonic acid.

18. The method of claim 16, wherein the catalyst is from about 0.1 wt % to about 1 wt % of the surface treatment composition.

19. The method of claim 1, wherein the surface treatment composition further comprises water, the water is at most about 2 wt % of the surface treatment composition.

20. The method of claim 1, wherein the surface treatment composition is substantially free of water.

21. The method of claim 1, wherein the surface treatment composition forms a surface treatment layer on a surface such that the surface has a water contact angle of at least about 65 degrees.

22. The method of claim 1, further comprising contacting the surface with at least one aqueous cleaning solution before contacting the surface with the surface treatment composition.

23. The method of claims 22, wherein the at least one aqueous cleaning solution comprise water, an alcohol, aqueous ammonium hydroxide, aqueous hydrochloric acid, aqueous hydrogen peroxide, an organic solvent, or a combination thereof.

24. The method of claim 22, further comprising contacting the surface with a first rinsing solution after contacting the surface with the at least one aqueous cleaning solution but before contacting the surface with the surface treatment composition.

25. The method of claim 1, further comprising contacting the surface with a second rinsing solution after contacting the surface with the surface treatment composition.

26. The method of claim 1, further comprising drying the surface.

27. The method of claim 1, further comprising removing the surface treatment layer.

28. A surface treatment composition, comprising:
   at least one aprotic solvent, and
   at least one surface treatment agent, the surface treatment agent being a Si-containing compound comprising a trimethylsilyl group, an aminosilyl group, or a disilazane group, provided that the disilazane group comprises no Si—H bond,
   wherein the surface treatment composition forms a surface treatment layer on a surface such that the surface has a water contact angle of at least about 50 degrees, and the surface has a pattern comprising a feature having a dimension of at most about 20 nm.

29. The composition of claim 28, wherein the at least one aprotic solvent is selected from the group consisting of carbonate solvents, lactones, ketones, aromatic hydrocarbons, siloxanes, glycol dialkyl ethers, glycol alkyl ether acetates, esters, ureas, lactams, dimethyl sulfoxide, and N-methyl pyrrolidone.

30. The composition of claim 29, wherein the at least one aprotic solvent comprises a carbonate solvent.

31. The composition of claim 30, wherein the carbonate solvent is propylene carbonate.

32. The composition of claim 28, wherein the at least one aprotic solvent comprises a lactone.

33. The composition of claim 32, wherein the lactone is gamma-butyrolactone.

34. The composition of claim 28, wherein the at least one aprotic solvent is from about 90 wt % to about 99.9 wt % of the surface treatment composition.

35. The composition of claim 28, wherein the Si-containing compound is a disilazane.

36. The composition of claim 35, wherein the disilazane is hexamethyldisilazane, heptamethyldisilazane, N-methyl hexamethyldisilazane, 1,3-diphenyltetramethyldisilazane, or 1,1,3,3-tetraphenyl-1,3-dimethyldisilazane.

37. The composition of claim 28, wherein the Si-containing compound comprises a trimethylsilyl group.

38. The composition of claim 37, wherein the Si-containing compound is N-(trimethylsilyl)dimethyl amine, N-(trimethylsilyl)diethylamine, 4-trimethylsilyloxy-3-penten-2-one, bis-trimethylsilylsulfate, methoxytrimethylsilane, N-allyl-N,N-bis(trimethylsilyl)amine, N-(trimethylsilyl)diethylamine, N, N-bis-trimethylsilyl urea, or tris-trimethylsilylphosphite.

39. The composition of claim 28, wherein the Si-containing compound is an aminosilane.

40. The composition of claim 39, wherein the aminosilane is bis-dimethylaminodimethylsilane or phenethyldimethyl (dimethylamino)silane.

41. The composition of claim 28, wherein the at least one surface treatment agent is from about 0.5 wt % to about 10 wt % of the surface treatment composition.

42. The composition of claim 28, further comprising a catalyst.

43. The composition of claim 42, wherein the catalyst is benzotriazole, phthalic anhydride, acetic anhydride, methanesulfonic acid, sulfuric acid, or trifluoromethanesulfonic acid.

44. The composition of claim 42, wherein the catalyst is from about 0.1 wt % to about 1 wt % of the surface treatment composition.

45. The composition of claim 28, wherein the surface treatment composition further comprises water, the water is at most about 2 wt % of the surface treatment composition.

46. The composition of claim 28, wherein the surface treatment composition is substantially free of water.

47. The composition of claim 28, wherein the surface treatment composition forms a surface treatment layer on a surface such that the surface has a water contact angle of at least about 65 degrees.

48. A surface treatment composition, comprising:
   from about 90 wt % to about 99.5 wt % at least one aprotic solvent selected from the group consisting of lactones, ketones, aromatic hydrocarbons, siloxanes, glycol dialkyl ethers, glycol alkyl ether acetates, esters, ureas, lactams, dimethyl sulfoxide, and N-methyl pyrrolidone, and
   from about 0.5 wt % to about 10 wt % at least one surface treatment agent, the surface treatment agent is a Si-containing compound comprising a trimethylsilyl group, an aminosilyl group, or a disilazane group, provided that the disilazane group comprises no Si—H bond;
   wherein the surface treatment composition forms a surface treatment layer on a surface such that the surface has a water contact angle of at least about 50 degrees, and the surface has a pattern comprising a feature having a dimension of at most about 20 nm.

49. The composition of claim 48, further comprising a catalyst or water.

50. A surface treatment composition, consisting of:
   at least one aprotic solvent, and
   at least one surface treatment agent, the surface treatment agent being a Si-containing compound comprising a trimethylsilyl group, an aminosilyl group, or a disilazane group, provided that the disilazane group comprises no Si-H bond.

51. The composition of claim 50, wherein the at least one aprotic solvent is selected from the group consisting of carbonate solvents, lactones, ketones, aromatic hydrocarbons, siloxanes, glycol dialkyl ethers, glycol alkyl ether acetates, esters, ureas, lactams, dimethyl sulfoxide, and N-methyl pyrrolidone.

52. The composition of claim 51, wherein the at least one aprotic solvent comprises a carbonate solvent.

53. The composition of claim 52, wherein the carbonate solvent is propylene carbonate.

54. The composition of claim 50, wherein the at least one aprotic solvent comprises a lactone.

55. The composition of claim 54, wherein the lactone is gamma-butyrolactone.

56. The composition of claim 53, wherein the at least one aprotic solvent is from about 90 wt% to about 99.9 wt% of the surface treatment composition.

57. The composition of claim 50, wherein the Si-containing compound is a disilazane.

58. The composition of claim 57, wherein the disilazane is hexamethyldisilazane, heptamethyldisilazane, N-methyl hexamethyldisilazane, 1,3-diphenyltetramethyldisilazane, or 1,1,3,3-tetraphenyl-1,3-dimethyldisilazane.

59. The composition of claim 50, wherein the Si-containing compound comprises a trimethylsilyl group.

60. The composition of claim 59, wherein the Si-containing compound is N-(trimethylsilyl)dimethylamine, N-(trimethylsilyl)diethylamine, 4-trimethylsilyloxy-3-penten-2-one, bis-trimethylsilylsulfate, methoxytrimethylsilane, N-allyl-N,N-bis(trimethylsilyl)amine, N-(trimethylsilyl)diethylamine, N, N-bis-trimethylsilyl urea, or tris-trimethylsilylphosphite.

61. The composition of claim 50, wherein the Si-containing compound is an aminosilane.

62. The composition of claim 61, wherein the aminosilane is bis-dimethylaminodimethylsilane or phenethyldimethyl(dimethylamino)silane.

63. The composition of claim 50, wherein the at least one surface treatment agent is from about 0.5 wt% to about 10 wt% of the surface treatment composition.

64. The composition of claim 50, wherein the composition consists of:
    the at least one aprotic solvent in an amount of from about 90 wt % to about 99.5 wt % of the composition, wherein the at least one aprotic solvent is selected from the group consisting of lactones, ketones, aromatic hydrocarbons, siloxanes, glycol dialkyl ethers, glycol alkyl ether acetates, esters, ureas, lactams, dimethyl sulfoxide, and N-methyl pyrrolidone, and
    the at least one surface treatment agent in an amount of from about 0.5 wt % to about 10 wt % of the composition.

* * * * *

UNITED STATES PATENT AND TRADEMARK OFFICE
CERTIFICATE OF CORRECTION

PATENT NO. : 10,593,538 B2
APPLICATION NO. : 15/928152
DATED : March 17, 2020
INVENTOR(S) : William A. Wojtczak, Keeyoung Park and Atsushi Mizutani Page 1 of 1

It is certified that error appears in the above-identified patent and that said Letters Patent is hereby corrected as shown below:

Column 16
Line 44, in Claim 12, delete "bis-trimethylsilyl sulfate," and insert -- bis-trimethylsilylsulfate, --
Line 45, in Claim 12, delete "N,N-bi s(trimethylsilyl)amine," and insert
-- N,N-bis(trimethylsilyl)amine, --

Column 17
Line 66, in Claim 38, delete "N-(trimethylsilyl)dimethyl amine," and insert
-- N-(trimethylsilyl)dimethylamine, --

Signed and Sealed this
Thirtieth Day of June, 2020

Andrei Iancu
*Director of the United States Patent and Trademark Office*